United States Patent
Yamada et al.

[11] Patent Number: 6,081,614
[45] Date of Patent: *Jun. 27, 2000

[54] SURFACE POSITION DETECTING METHOD AND SCANNING EXPOSURE METHOD USING THE SAME

[75] Inventors: Yuichi Yamada, Utsunomiya; Shigeyuki Uzawa, Tokyo, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/687,986
[22] Filed: Jul. 29, 1996
[30] Foreign Application Priority Data Aug. 3, 1995 [JP] Japan .................. 7-198648

[51] Int. Cl.[7] ..................... G06K 9/00
[52] U.S. Cl. ................ 382/151; 382/141; 382/145
[58] Field of Search ................... 382/141, 145, 382/147, 151, 149; 356/394, 152; 250/561, 548, 557; 355/43, 53, 55–57

[56] References Cited

U.S. PATENT DOCUMENTS

| | | | |
|---|---|---|---|
| 4,558,949 | 12/1985 | Uehara et al. | 356/152 |
| 4,599,000 | 7/1986 | Yamada | 356/401 |
| 4,655,599 | 4/1987 | Ayata et al. | 356/401 |
| 4,933,715 | 6/1990 | Yamada et al. | 355/53 |
| 4,978,220 | 12/1990 | Abramovich et al. | 356/394 |
| 5,118,957 | 6/1992 | Kawashima et al. | 250/561 |
| 5,142,156 | 8/1992 | Ozawa et al. | 250/548 |
| 5,194,893 | 3/1993 | Nishi | 355/53 |

FOREIGN PATENT DOCUMENTS

| | | | |
|---|---|---|---|
| 0585041 | 3/1994 | European Pat. Off. | G03F 9/00 |
| 3-157822 | 11/1989 | Japan | G11B 7/09 |
| 2-52707 | 11/1990 | Japan | C22C 5/02 |

*Primary Examiner*—Jose L. Couso
*Assistant Examiner*—Duy M. Dang
*Attorney, Agent, or Firm*—Fitzpatrick, Cella, Harper & Scinto

[57] ABSTRACT

A surface position detecting method, wherein, while an object having a region with a pattern structure is scanned relative to a surface position detecting system in a scan direction, different from a surface position detecting direction of the surface position detecting system, the surface position detecting system performs surface position detection sequentially at a plurality of detection points, which are disposed within the region and along the scan direction. The method includes steps of measuring beforehand errors to be produced with respect to the detection points due to a difference in pattern structure among the detection points disposed along the scan direction and correcting, when the surface position detection is sequentially performed by the surface position detecting system at the detection points along the scan direction while the object is scanned in the scan direction relative to the surface position detecting system, a result of the detection by the surface position detecting system at each detection point, on the basis of a measured error corresponding to that detection point, measured in the measuring step.

7 Claims, 10 Drawing Sheets

SURFACE POSITION DETECTING METHOD AND SCANNING EXPOSURE METHOD USING THE SAME

FIELD OF THE INVENTION AND RELATED ART

This invention relates to a surface position detecting method and, more particularly, to a surface position detecting method applicable to a slit-scan type or scanning exposure type exposure apparatus, for continuously detecting the position or tilt of the surface of a wafer with respect to the direction of an optical axis of a projection optical system. In another aspect, the invention is concerned with a scanning exposure method using such a surface position detecting method.

Recently, the size of a memory chip is gradually increasing due to the need for an enlargement in the capacity of the memory in contrast to the need for a reduction in the cell size and in a resolvable line width of an exposure apparatus. For example, it has been reported that in the first generation of 256M, the size is about 14×25 mm.

With this chip size, the exposure region of a diameter of 31 mm of a reduction projection exposure apparatus (stepper), which is currently used as an exposure apparatus for a critical layer, allows exposure of only one chip per one exposure, such that the throughput is very low. It is, therefore, desired to develop an exposure apparatus of a large exposure area. As a large picture field exposure apparatus, conventionally, reflection projection exposure apparatuses have been used widely as a semiconductor exposure apparatus for a rough layer or as an exposure apparatus for a large picture field liquid crystal display device such as a monitor, wherein a large throughput is required. These exposure apparatuses are slit-scan type (scanning exposure type) exposure apparatuses based on a mask-wafer relative scan, wherein a mask is linearly scanned with an arcuate slit-like illumination light and, by using a concentric reflection mirror optical system, the whole surface of a wafer is exposed at once.

As regards the focusing of a mask image in these apparatuses, in order to successively bring the surface of a photosensitive substrate (wafer or glass plate coated with a photoresist or the like) into registration with a best imaging plane of a projection optical system, level measurement and corrective drive for auto-focusing and auto-leveling are continuously performed during the scanning exposure process.

A level and surface position detecting mechanism in such an apparatus uses a method which uses an oblique projection optical system wherein light is projected to the surface of a wafer obliquely from above and wherein reflection light from the photosensitive substrate is detected as a positional deviation upon a sensor, or a method which uses a gap sensor such as an air micro-sensor or an electrostatic capacity sensor. From the measured values of level during the scan, a corrective drive amount to the level (height) and tilt as the measurement position passes the exposure slit region is calculated, and a correction is made.

If a projection optical system of a currently used slit-scan type exposure apparatus is modified so as to provide a resolving power that meets 256M or larger, the following problems will arise.

That is, with an increasing numerical aperture (N.A.) of a reduction projection system to meet the further miniaturization of a circuit pattern, the tolerance for the depth of focus in the pattern transfer process is reduced more and more. In exposure apparatuses currently used for a rough process, a tolerable depth is not less than 5 microns. Thus, a measurement error included in a measured value, being measured successively during the scanning exposure, or the effect of a surface step within a chip can be disregarded. However, taking into account the applicability to 256M, the tolerable depth will be not less than 1 micron. Therefore, it is necessary to correct the aforementioned measurement error or the effect of a surface step within a chip (pattern structure within a chip).

In reduction projection exposure apparatuses, plural chips having the same pattern structure are formed on a photosensitive substrate, and the surface shape thereof is substantially reproduced at the exposure position. Thus, by executing trial printing using a pilot wafer prior to the lot processing, it is possible to correct the offset described above. Namely, it is possible to perform a calibration to measurement points of a focus detection system. However, in a slit-scan type exposure apparatus wherein plural points within an exposure region are measured while executing the scan, if a calibration of the focus sensor is to be performed with respect to each measurement point and by printing; and if a correction is to be done to twenty (20) points within a chip, in order to check the image quality through a microscope, it takes a long time, i.e., twenty times longer than that made in the reduction projection exposure apparatus. This considerably lowers the production efficiency.

Also, even if the sensor is arranged to observe the resist surface stably, making a correction along the surface will undesirably cause defocus in the following case. That is, the structure of a memory within the exposure region comprises a memory cell portion and peripheral circuit portions. Usually, the exposure region in which the critical resolution performance is required is concentrated to the memory cell portion.

In an example of a 256M chip, it comprises a memory cell region wherein a critical line width transfer is required and peripheral circuit portions of loose rule, extend longitudinally and laterally so as to divide the memory cell portion. Although flattening is done to the cell portion and the peripheral circuit portion by using a CMP (chemical mechanical polishing) process or a recess array forming process, for example, there still remains a surface step of about 1 micron.

Figure 4A:
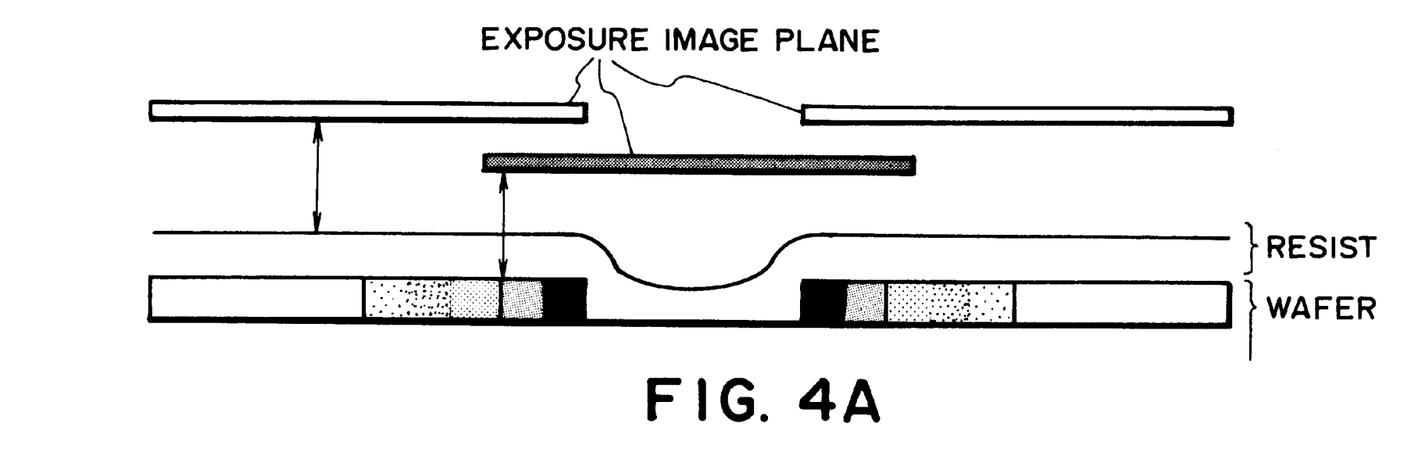
FIGS. 4A and 4B are schematic views for explaining the relation between an image plane position of slit exposure with focus control and an exposure region representing an IC surface topography during a scan.

If a correction in the Z direction is going to be done exactly in accordance with a measured value while scanning this region, such as shown in FIG. 4A, namely, if the exposure image plane of the slit is going to be tracked continuously along the surface of the resist, and if the width of the slit in the scan direction (i.e., the size of the minor side) is 5 mm whereas the peripheral circuit portion has a width of 2 mm, then there occurs a defocus of about 1 micron in the regions (hatched regions in FIG. 4A) of a size of 2 mm of the memory cell, which regions are at opposite sides of the peripheral circuit portion having the surface step. Since the line width control for a peripheral circuit portion is loose as compared with that for the memory cell, the focus depth enlarges accordingly.

Considering the points described above, it is not desirable to cause the exposure image plane to follow the real surface step (pattern structure). From the viewpoint of precision, it will be advantageous to control the surface step data as a correction amount. In any event, there is no offset control and correction procedure established.

SUMMARY OF THE INVENTION

It is an object of the present invention to provide a surface position detecting method by which the calibration of a focus measuring system can be performed with respect to a number of points and by which the position of the surface of a wafer can be detected with good precision.

Particularly, it is an object of the present invention to provide a high-precision surface position detecting method for a slit-scan type exposure process.

In accordance with an aspect of the present invention, there is provided a surface position detecting method wherein an object with a region having a pattern structure formed thereon is relatively and scanningly moved relative to surface position detecting means and wherein surface positions of plural detection points within the region are measured by the surface position detecting means, said method comprising the steps of: detecting an error at each detection point during detection of the surface position through the surface position detecting means, which error results from a difference in pattern structure between the detection points; and correcting, as the object is relatively and scanningly moved relative to the surface position detecting means so that the surface position of each detection point in the region is detected by the surface position detecting means, the result of the detection at each detection point on the basis of an error corresponding to that detection point.

In one preferred form of this aspect of the present invention, the object has plural regions, each having the same pattern structure as that of the first-mentioned region, and said method further comprises correcting, as the object is relatively and scanningly moved relative to the surface position detecting means so that the surface positions at locations within the regions corresponding to the detection points are detected by the surface position detecting means, the result of the detection at each detection point on the basis of an error corresponding to that detection point.

The error detecting step may comprise detecting a surface shape of the object on the basis of surface position data related to corresponding locations in the regions, and detecting the error on the basis of the surface shape.

In accordance with another aspect of the present invention, there is provided a scanning exposure method wherein a reticle and a wafer are scanningly moved in a timed relation relative to a projection optical system and wherein, for projection of a pattern of the reticle onto the wafer through the projection optical system, surface positions at plural detection points, arrayed along a scan direction, within an exposure region on the wafer having the same pattern structure are sequentially detected so that the exposure region is placed at an image plane position of the projection optical system, said method comprising the steps of: detecting an error at each detection point during detection of the surface position, which error results from a difference in pattern structure between the detection points; and correcting, as the surface positions at the detection points are detected sequentially, the result of the detection at each detection point on the basis of an error corresponding to that detection point.

In one preferred form of this aspect of the present invention, the wafer has plural regions, each having the same pattern structure as that of the first-mentioned region, and said method further comprises correcting, as the surface positions at locations within the regions corresponding to the detection points are detected sequentially, the result of the detection at each detection point on the basis of an error corresponding to that detection point.

The error detecting step may comprise detecting a surface shape of the wafer on the basis of surface position data related to corresponding locations in the regions, and detecting the error on the basis of the surface shape.

In accordance with a further aspect of the present invention, there is provided a method of detecting a surface shape of an object having regions with the same pattern structure, wherein surface positions at corresponding locations in the regions of the object are detected by using surface position detecting means arranged to detect a surface position with light projected obliquely to the object, said method comprising: a first detecting step for detecting surface positions at corresponding locations within the regions by using the surface position detecting means; a driving step for moving the object to a predetermined position on the basis of the detection at said first detecting step; a second detecting step for detecting again, after said driving step, the surface positions at the corresponding locations in the regions by using the surface position detecting means; and a calculating step for calculating the surface positions of the regions on the basis of a driving amount at said driving step and of the detection at said second detecting step.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
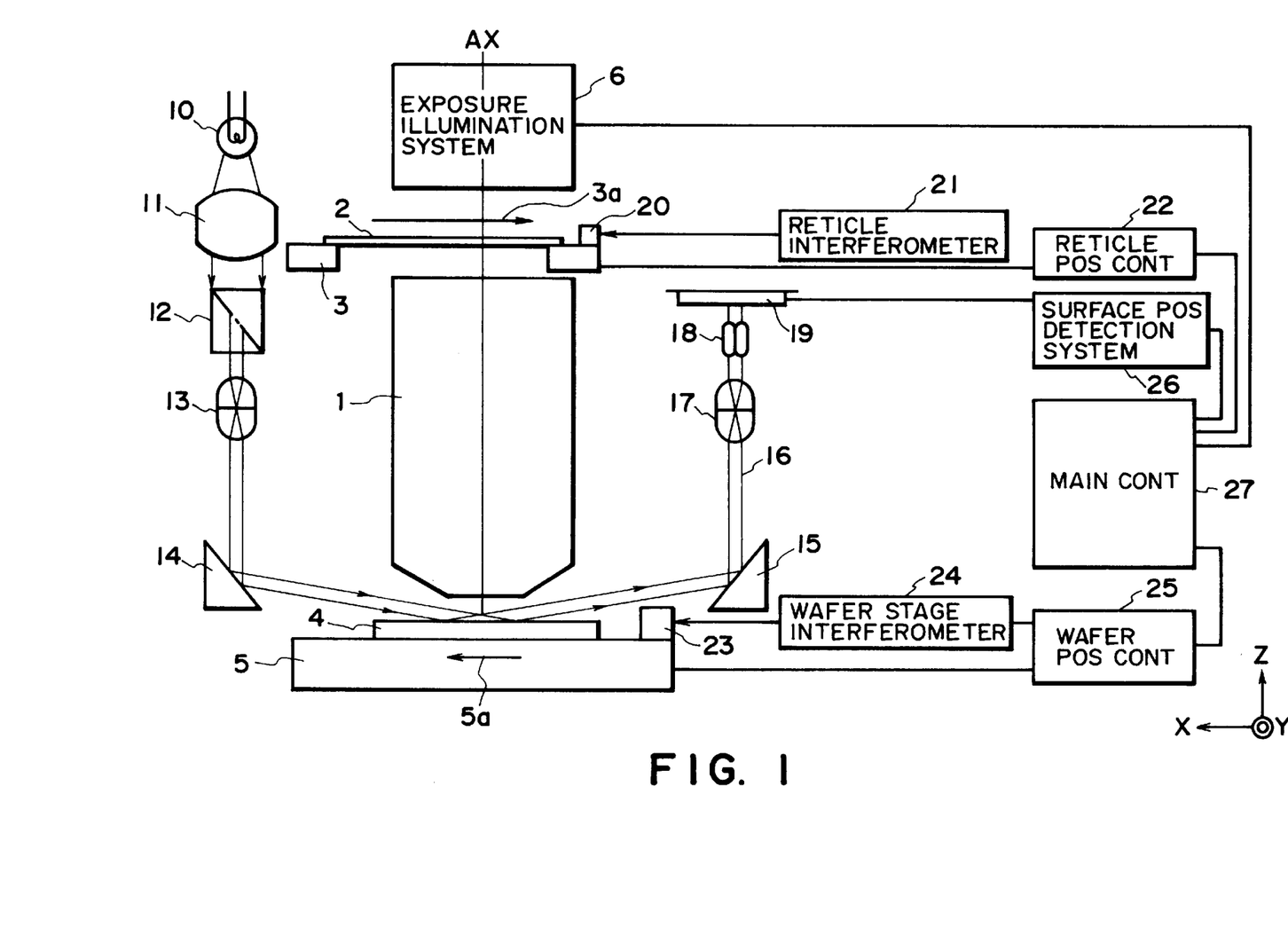
FIG. 1 is a fragmentary and schematic view of a slit-scan type projection exposure apparatus to which a surface position detecting method of the present invention is applicable.

FIG. 1 is a fragmentary and schematic view of a slit-scan type projection exposure apparatus to which the surface position detecting method of the present invention is applicable.

Denoted in FIG. 1 at 1 is a reduction projection lens having an optical axis AX and an image plane which is perpendicular to the Z direction as illustrated. Reticle 2 is held by a reticle stage 3, and a pattern of the reticle 2 is projected by the reduction projection lens in a reduced scale of 1:4 or 1:2 corresponding to the magnification thereof, whereby an image is formed on the image plane. Denoted at 4 is a wafer having a surface coated with a resist. Through a process exposure process or processes, a number of exposure regions (shots) having the same pattern structure are formed on the wafer. Denoted at 5 is a stage on which the wafer is placed. The wafer stage 5 comprises a chuck for attracting and fixing the wafer 4 to the stage 5, an X-Y stage movable horizontally along an X-axis direction and a Y-axis direction, a leveling stage movable along a Z-axis direction (optical axis AX direction of the projection lens 1) and also rotationally movable about the X and Y axes, and a rotatable stage being rotationally movable about the Z axis. The wafer stage 5 thus provides a six-axis correction system for bringing the image of the reticle pattern into coincidence with the exposure region on the wafer.

Denoted at 10–19 in FIG. 1 are components of a detection optical system for detecting surface position and tilt of the wafer 4. Among them, denoted at 10 is a light source, which comprises a white light source or an illumination unit arranged to project light of a high-luminance light emission diode having different peak wavelengths. Denoted at 11 is a collimator lens for transforming the light from the light source 10 into parallel light having a substantially uniform sectional intensity distribution. Denoted at 12 is a slit member of a prism-like shape, comprising a pair of prisms being cemented so that their slant surfaces are opposed to each other. A plurality of openings (e.g., six pinholes) are formed at the cemented surface by using a light blocking film such as a chromium film. Denoted at 13 is an optical system comprising a bi-telecentric optical system, which serves to direct six independent light beams from the pinholes of the slit member 12 to six measurement points on the wafer 4 surface, by way of a mirror 14. While only two light beams are illustrated in FIG. 1, each beam in the drawing represents three light beams, which are placed in the direction perpendicular to the sheet of the drawing. Here, with respect to the lens system 131, the plane on which the pinholes are formed and the plane which includes the surface of the wafer 4 are disposed to satisfy the Scheimpflug's condition.

Figure 2:
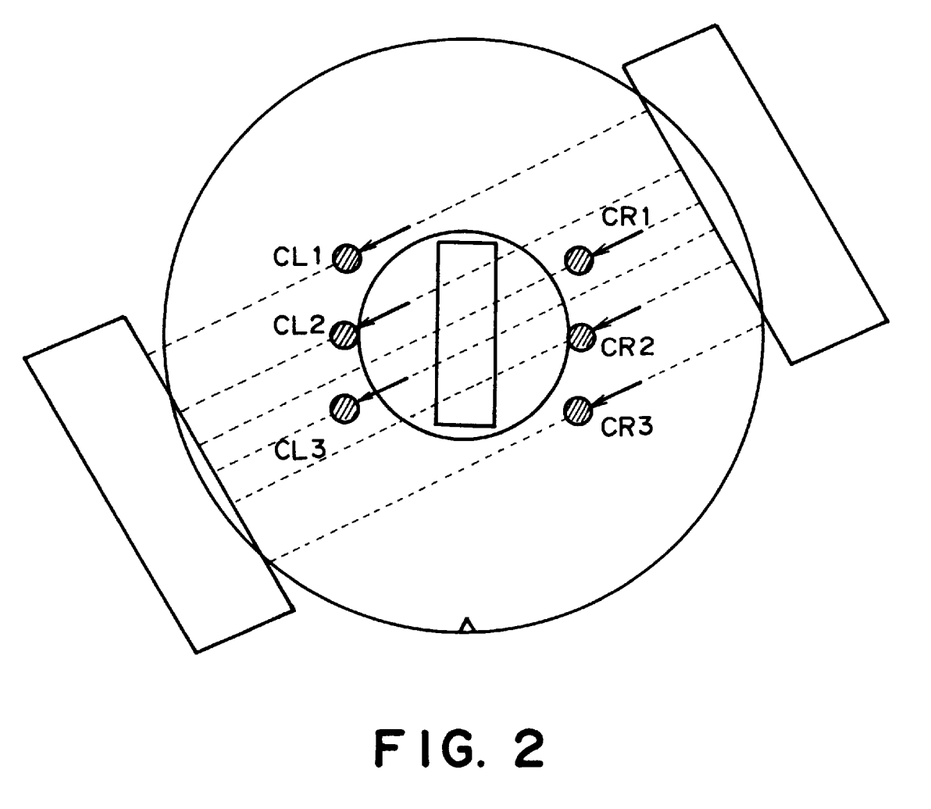
FIG. 2 is a schematic view for explaining a positional relation between an exposure slit and measurement points, in the surface position detection by a detection optical system.
Figure 3:
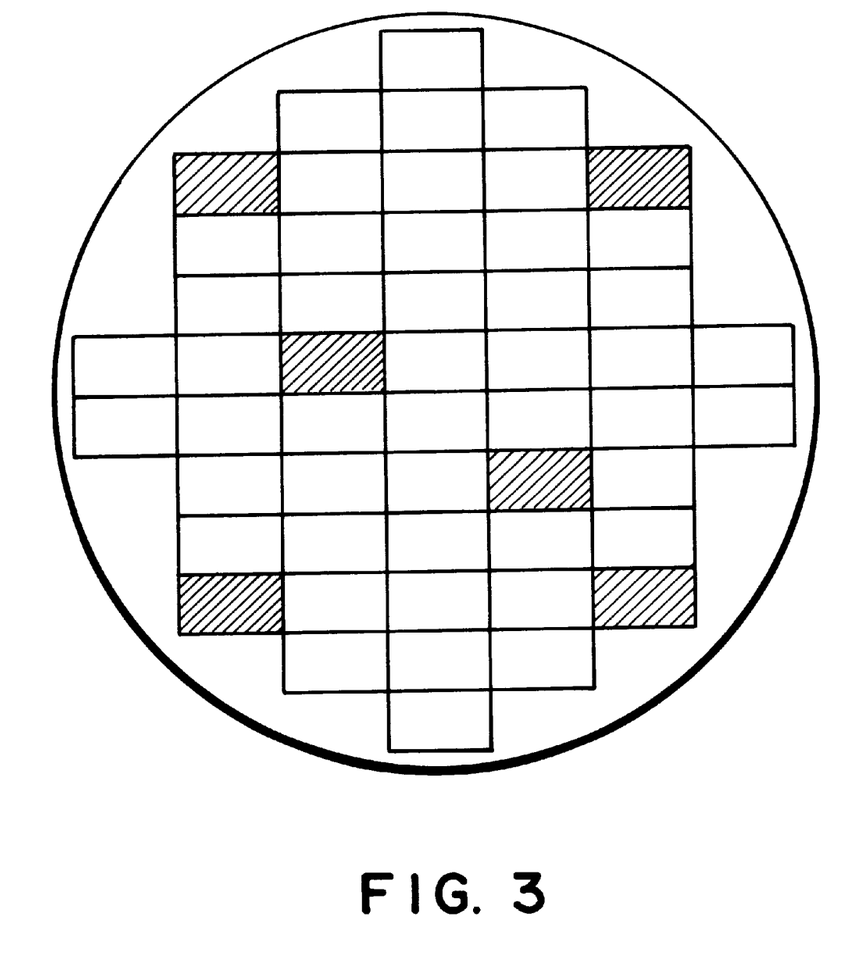
FIG. 3 is a plan view for explaining an example of arrayed exposure regions on a wafer and a selection of sample shots to which pre-scanning is to be done.

In this embodiment, the incidence angle $\phi$ of each light beam from the light projecting means upon the wafer 4 surface (i.e., the angle defined with respect to a normal to the wafer surface, that is, with respect to the optical axis) is not less than 70 deg. As shown in FIG. 3, there are a plurality of exposure regions (shots) having the same pattern structure, on the wafer 4 surface. The six light beams passing the lens system 13 are projected and imaged upon separate measurement points on the pattern region, as shown in FIG. 2. Also, in order that the six measurement points are observed independently of each other within the plane of the wafer 4 surface, light is projected in a direction rotated from the X direction (scan direction 5a) along the X-Y plane by an angle $\theta$ (e.g., 22.5 deg.).

In this manner and as disclosed in Japanese Patent Application No. 157822/1991, spatial disposition of the respective components is set appropriately to facilitate high precision detection of surface position information.

Next, the structure at a side for detecting reflection light from the wafer 4, namely, the structure of elements 15–19, will now be explained.

Denoted at 16 is a light receiving optical system which comprises a bi-telecentric optical system. It receives six reflection light beams from the wafer 4 surface, by way of a mirror 15. Stop member 17 is provided within the light receiving optical system 16, in common to the six measurement points. It serves to interrupt higher order diffraction light (noise light) produced by a circuit pattern formed on the wafer 4. The light beams passed through the bi-telecentric light receiving optical system 16 have their axes parallel to each other, and they are re-imaged upon a detection surface of a photoelectrically converting means unit 19 into light spots of the same size, by means of six separate correction lenses of a correction optical system unit 18.

As regards the light receiving side (elements 16–18), plate tilt correction is made so that the measurement points on the wafer 4 surface and the detection surface of the photoelectrically converting means unit 19 are placed in an optically conjugate relation. Therefore, any local inclination at any measurement point does not cause a change in position of the pinhole image on the detection surface. Thus, in response to a change in level (height) of each measurement point in the optical axis AX direction, the pinhole image on the detection surface changes.

The photoelectrically converting means unit 19 comprises six one-dimensional CCD line sensors. This is advantageous as compared with the structure using a two-dimensional sensor, in the following points. First, in structuring the correction optical system unit 18, separation of the photoelectrically converting means unit 19 expands the tolerance for disposition of optical components or mechanical holders. Second, while the optical magnification of the portion from the mirror 15 to the correction optical system unit 18 should be made large in order to improve the detection resolution, the arrangement wherein the light path is divided and divided lights are incident on separate sensors provides the ability to make the structure compact. Further, in the slit-scan type, it is required to perform continuous focus measurement during the exposure process so that a reduction of measurement time is much desired. When a two-dimensional CCD sensor is used, while it may be attributable to reading of data more than needed, it takes a long read-out time, e.g., 10 times longer or more than that when one-dimensional CCD sensors are used.

Next, the exposure system of the slit-scan type will be explained.

As shown in FIG. 1, the reticle 2 is attracted to and held by the reticle stage 3. Then, it is scanned along a plane perpendicular to the optical axis AX of the projection lens 1 and in the direction of an arrow 3a (X-axis direction), at a constant speed. Additionally, as regards a direction perpendicular to the arrow 3a (i.e., the Y-axis direction, perpendicular to the sheet of the drawing), a correction drive is made so that it is scanned while holding its target coordinate position constantly. Positional information of the reticle stage with respect to the X and Y directions is measured continuously by projecting laser beams from a reticle X-Y interferometer system 21 to an X-Y bar mirror 20 fixedly mounted on the reticle stage of FIG. 1.

Exposure illumination optical system 6 comprises a light source such as an excimer laser, for example, for producing pulsed light. It further comprises a beam shaping optical system, an optical integrator, a collimator and a mirror, for example, all being unshown in the drawing. The components of the exposure illumination optical system are made of a material or materials that efficiently transmit or reflect pulse light, which is in the deep ultraviolet region. The beam shaping optical system serves to transform the sectional shape (including the size) of a received beam into a desired shape. The optical integrator serves to make uniform the light distribution characteristic so as to illuminate the reticle 2 with a uniform illuminance. By means of a masking blade (not shown) within the exposure illumination system 6, a rectangular illumination region corresponding to the chip size is defined. The pattern of the reticle 2, as illuminated partly by that illumination region, is projected onto the resist coated wafer 4 through the projection lens 1.

Main control unit 27 shown in FIG. 1 serves to control the whole system, such that, while adjusting the position of the slit image of the reticle 2 with respect to a predetermined exposure region of the wafer 4 along the X-Y plane (i.e., X and Y positions and rotation θ about the Z axis) as well as the position in the Z direction (i.e., the rotations α and β about the X and Y axes, respectively, and height Z along the Z axis), the reticle and the wafer are scanned in a timed relation relative to the projection optical system, and also so that the pattern of the reticle 2 is projected and printed by scan onto the wafer. Namely, as regards the alignment of the pattern of the reticle in the X-Y plane, control data is calculated from positional data produced by the reticle interferometer 21 and a wafer stage interferometer 24 as well as from positional data produced by an alignment microscope (not shown), by which control data, the reticle position controlling system 22 and the wafer position controlling system 25 are controlled.

When the reticle stage 3 is scanned or scanningly moved in the direction of arrow 3a in FIG. 1, the wafer stage 5 is scanningly moved in the direction of an arrow 5a at a speed corrected by an amount corresponding to the reduction magnification of the projection lens. The scan speed of the reticle stage 3 is determined on the basis of the width, in the scan direction, of the masking blade (not shown) of the exposure illumination optical system 6 and of the sensitivity of the resist applied to the wafer 4, so as to assure a higher throughput.

As regards the alignment of the reticle pattern in the Z-axis direction, that is, the registration of the same with the image plane, the leveling stage of the wafer stage is controlled through the wafer position controlling system 25, on the basis of the result of the calculation of the surface position detecting system 26 that detects height data of the wafer 4. Namely, from height data related to three light spots (for wafer level measurement) defined in the scan direction and adjacent to the slit, tilt in a direction perpendicular to the scan direction as well as the height with respect to the optical axis AX direction are calculated. Then, the amount of correction into coincidence with the best image plane position at the exposure position is determined, on the basis of which, correction is made.

Now, the process of detecting the position of an exposure region of the wafer 4 in accordance with the surface position detecting method of the present invention will be explained.

Figure 4B:
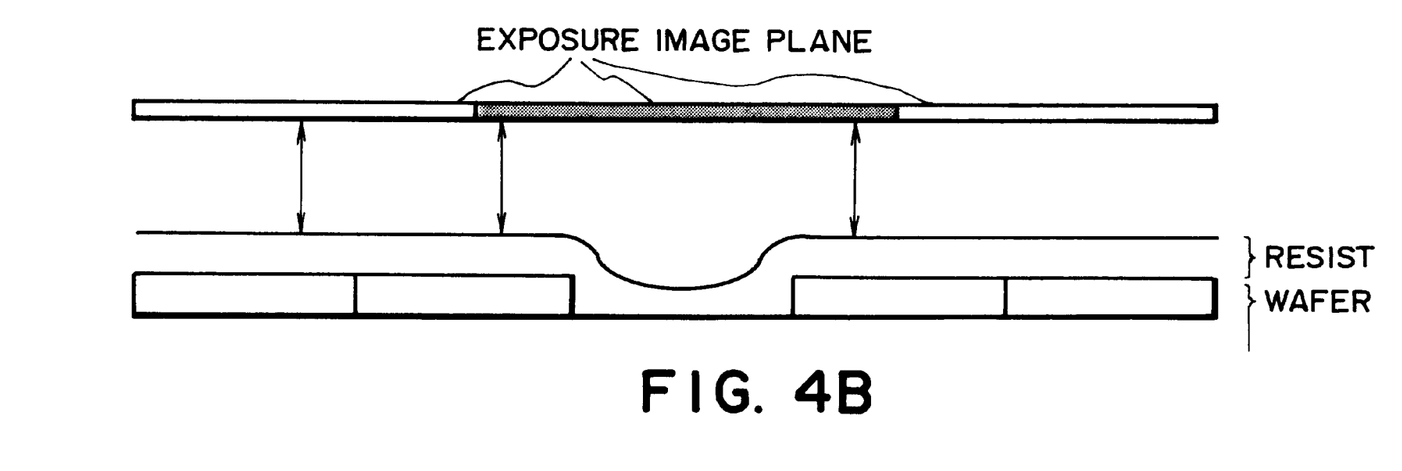

In order to detect the position of the exposure region on the wafer 4 in the Z direction, that is, to detect a deviation of tilt (α and β) and position (Z) with respect to the image plane, it is necessary to measure the surface of the wafer 4 accurately and to take into account the relation between the shape of the illumination region and the pattern structure (actual surface step) of the exposure region. When an optical detection system is used for the former (accurate surface measurement), there are factors of detection error such as follows. That is, there is an effect of interference between light reflected by the resist surface of the wafer 4 and light reflected by the substrate surface of the wafer 4. Such an effect changes in dependence upon the material of the substrate surface, which is, in a broad meaning, a pattern structure. For a high reflection wiring material such as Al, for example, it is of an amount not negligible. When an electrostatic capacity sensor is used as a wafer surface position detecting sensor, in a case of a GaAs wafer which is used as a substrate of a high-speed element or light emitting diode, because of a dielectric material, it has a large measurement offset as compared with a Si wafer. While the point of a pattern structure (actual surface step) of the exposure region has been mentioned as another example of a measurement error, it is not desirable to cause the exposure image plane to follow the actual surface step, as has been described before. From the viewpoint of precision, the surface step data should preferably be used as a correction amount, such as shown in FIG. 4B.

Figure 5:
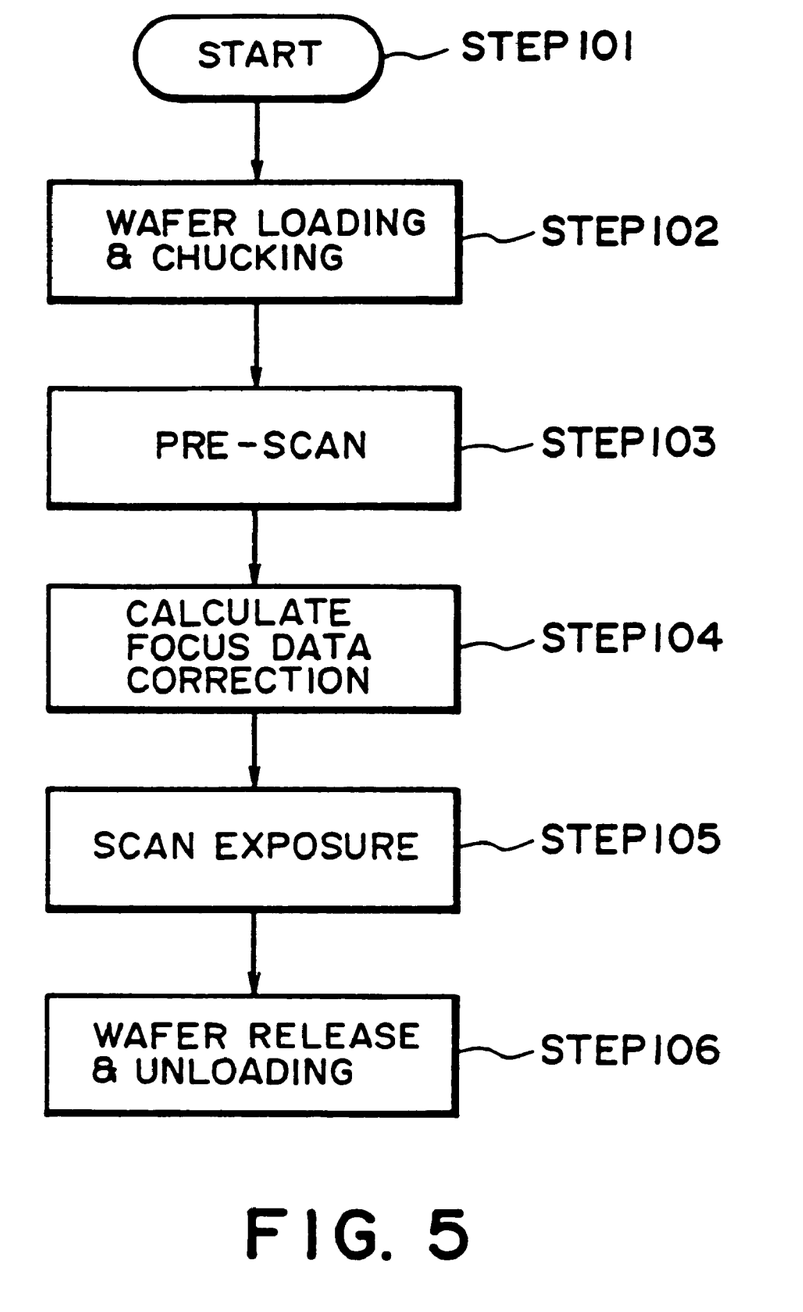
FIG. 5 is a flow chart for explaining, as an example, main operations in offset measurement and surface position correction during exposure of shots, in accordance with a surface position detecting method of the present invention.

This correction method will be explained with reference to the flow chart of FIG. 5.

At step 101, a start command is inputted. At step 102, a wafer is loaded onto the stage, and it is held attracted to the chuck. Then, for measurement of the surface shape (plural surface positions) of an exposure region of a chip, at step 103 and as shown in FIG. 3, a pre-scan measurement is performed to plural sample shots as depicted by hatching (i.e., surface positions at plural locations in respective exposure regions are measured while actually scanning the wafer). That is, at plural points on the wafer, the surface state (focus measurement data at multiple points) is measured through a scan. Thereafter, by using the measured values of the surface position (surface position data), at step 104, a correction amount (error attributable to the pattern structure), for correcting the surface position detected values during the scan exposure into the distance to the best exposure image plane position, is calculated. That is, from the scan measurement data, a measurement error and a surface step correction amount are calculated in terms of a difference with the best focus position.

When this is completed, at step 105 and during the scan exposure, the surface position detected value at each detection point (where surface position detection is performed) is corrected in accordance with the correction amount corresponding to the pattern structure at that detection point. On the basis of the thus corrected surface position detected value, the exposure region is brought into coincidence with the exposure image plane, and the exposure process is performed. That is, the focus measurement data is corrected by using the correction amount, and a correction amount to the image plane position is calculated. Based on this, the exposure region is brought into coincidence with the image plane.

The correction amount determined through this pre-scan measurement depends on the pattern structure (actual surface step in the exposure region or material of the substrate). For wafers of the same lot or those having been treated by the same process, it is considered that they have the same pattern structure. Thus, the correction amount determined with respect to the first one of those wafers may be used for the remaining wafers. The flow chart of FIG. 6 shows this.

Figure 6:
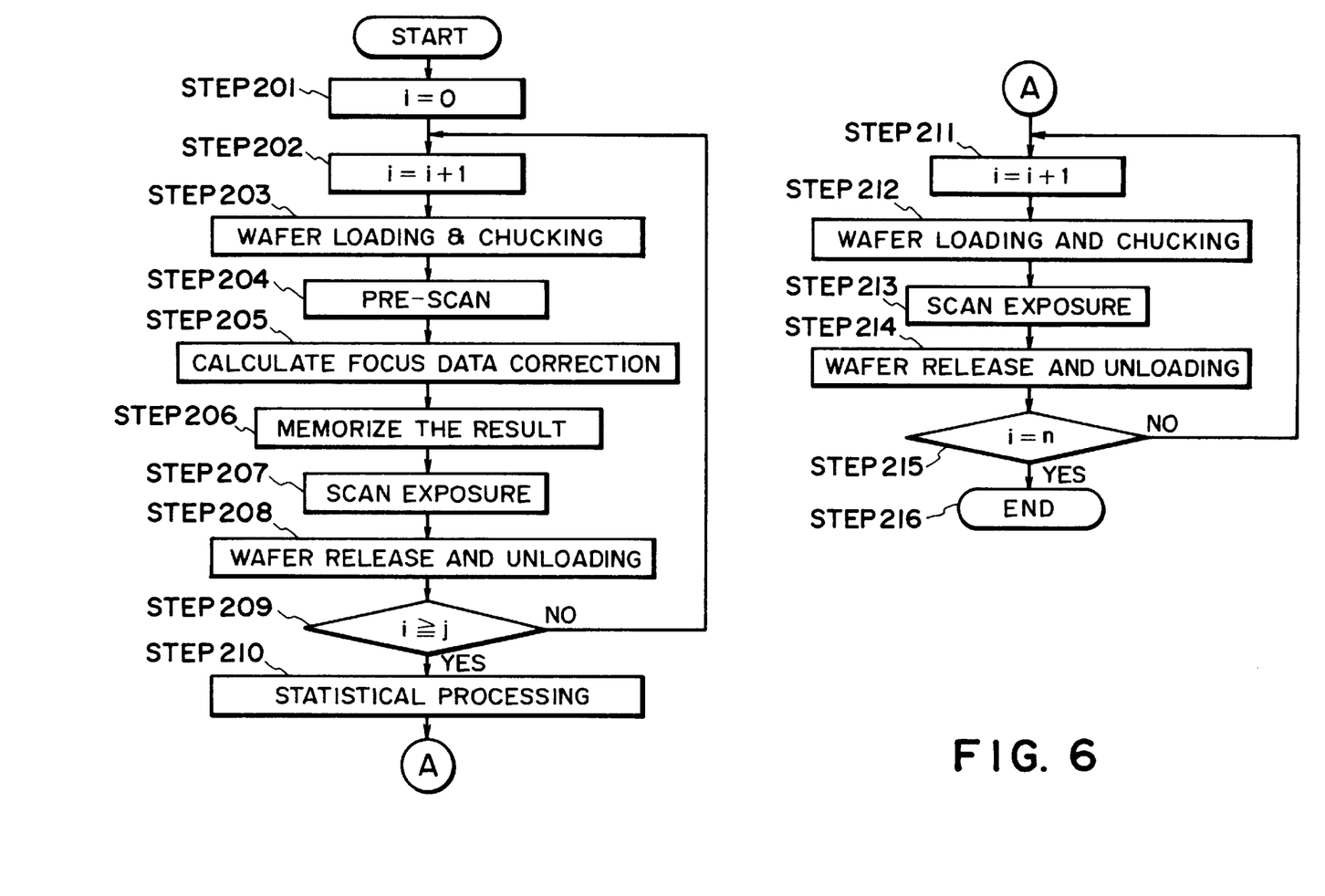
FIG. 6 is a flow chart for explaining, as an example, lot processing that uses a surface position detecting method of the present invention.

In the flow chart of FIG. 6, at step 204, a pre-scan is done. That is, at plural points on the wafer, the surface state (focus measured data at multiple points) in the exposure regions is measured by scan. At step 205, a surface detection focus data correction amount is calculated. That is, from the scan measurement data, a measurement error and surface step correction amount are calculated in terms of the difference with the best focus position. Step 206 is a memorizing step where the measurement error, the surface step correction amount and positional information of the measurement points are stored into the main control unit 27. At step 207, scan exposure is performed. That is, the focus measured data is corrected by using the correction amount, and the correction amount to the image plane position is calculated. The exposure region is then brought to the image plane.

At step 210, statistical processing (such as averaging of plural data of a number "i", for example) is performed for the data memorized at step 203.

At step 213, scan exposure is performed. That is, the focus measured data is corrected by using the measurement error, surface step correction amount and positional information of the measurement points, obtained at step 210. A correction amount for the image plane position is calculated, and the exposure region is brought to the image plane.

With the sequence such as illustrated in the flow chart of FIG. 6, the throughput can be improved significantly.

Now, a description will be made of a process of measuring an offset (correction amount) for correcting measurement error factors, depending on the pattern structure (such as an actual surface step in an exposure region or a material of the substrate), from the detected values of surface position obtained during the scan exposure.

Figure 7:
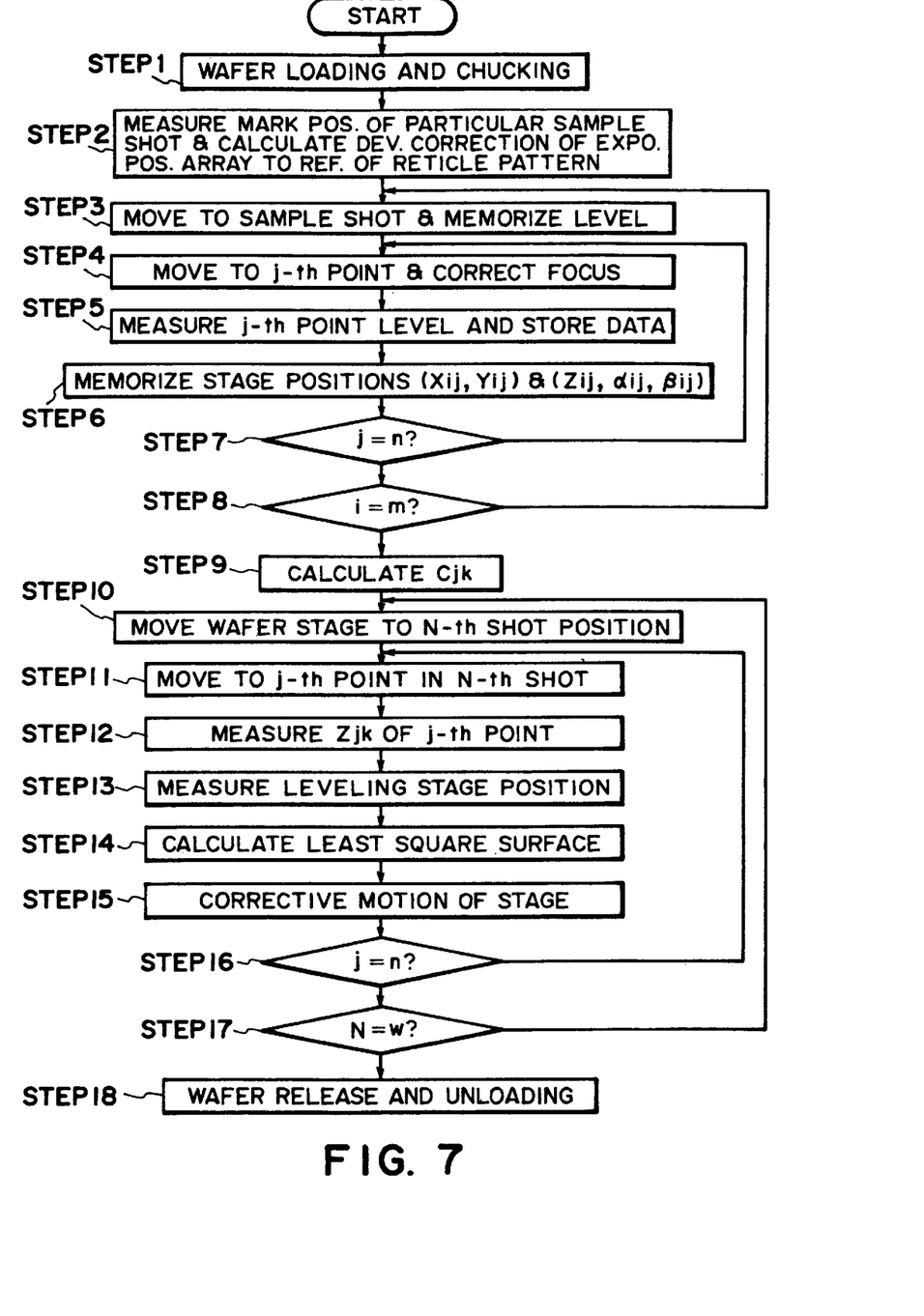
FIG. 7 is a flow chart for explaining, as an example, offset measurement and surface position corrective motion during exposure of shots.

Referring to the flow chart of FIG. 7, the manner of determining an offset value for correcting an error depending on the pattern structure (actual surface step in an exposure region or a material of the substrate), which is a problem in the detection of the surface position and tilt of the surface of a wafer, on the basis of the surface position measured data, will be explained.

First, for an offset calculation, plural exposure regions to be scan measured are determined beforehand as sample shots. As regards these sample shots, it is desirable to select the positions of those exposure regions such as depicted by hatching in FIG. 3, for example, which are symmetrical with each other with respect to the center of the wafer so that they are less affected by the surface precision of the wafer and from which regions the information related to the whole surface is easily obtainable. This is because, while taking into account the polishing treatment such as CMP or any other treatment, due to the shape characteristic of the wafer, which is of circular shape, deformation will occur symmetrically with respect to the center.

First, at step 1, a wafer 4 is placed on the chuck of the wafer stage 5, and it is attracted to and held by the chuck. Then, at step 2, an alignment mark of a particular shot is moved to a position below an autoalignment microscope (not shown) and, after focus correction of the autoalignment microscope, the position of the alignment mark is measured. This measurement is performed to shots of a number "g". From alignment data produced as a result of the measurement, the shot layout data at all exposure positions upon the wafer is corrected, such that during the scan exposure every exposure region can be aligned correctly with the reticle. Namely, the correction amount for correcting a deviation of each exposure position with respect to the reference position of the reticle pattern is calculated. If this is done, since the patterns of respective exposure positions have been processed by the same reticle, the pattern structure at the time of the j-th surface position measurement operation as defined in terms of the stage coordinates, at respective exposure positions, will be completely the same within the range of alignment precision. Actually, it has been confirmed that, at the measurements, substantially the same measured data are produced. In accordance with the layout information obtained at this step, subsequent sample shot movement and scans of sample shots are performed. Thus, during the scanning measurement to different shots, a measurement is made to the same location of the same pattern structure within the range of the alignment precision. At the stage of this measurement, a tilt component of the whole wafer surface is measured by means of the focus detecting system and, prior to step 3, the leveling stage within the wafer stage 5 is actuated to correct the tilt component of the whole wafer.

Figure 8A:
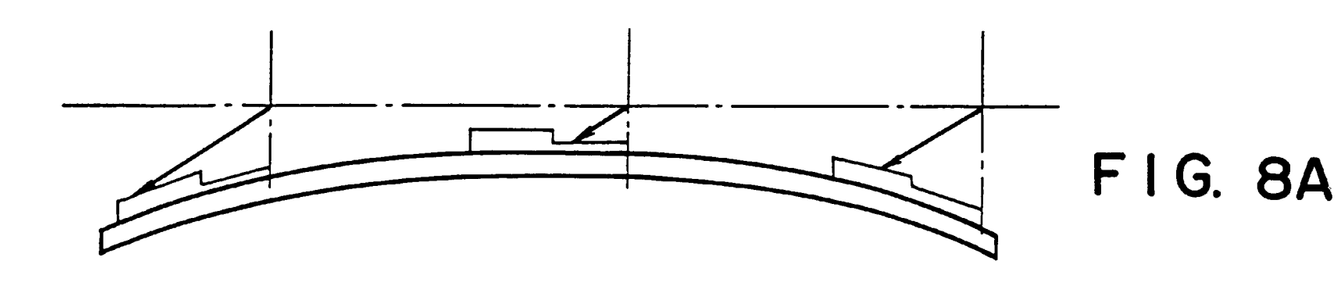
FIGS. 8A and 8B are schematic views for explaining the necessity of a corrective motion for the calculation of precision of focus offset.
Figure 8B:
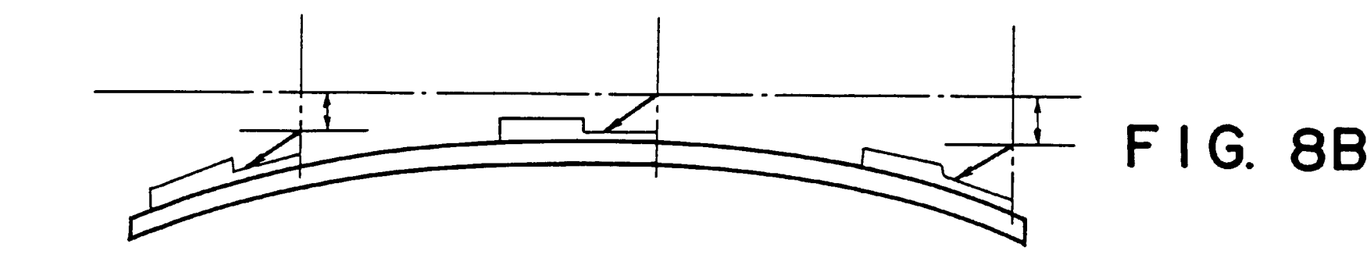

When the shot layout correction at step 2 is completed, the sequence goes to step 3 for the offset measurement procedure. First, in accordance with an output signal of the wafer laser interferometer system 24, the wafer is moved to the position of a j-th measurement point (detection point) among the predetermined sample shots Si (i=1 to m) (step 3 and step 4). There, the detection optical system (10–19) is used to detect surface position measured data of the wafer surface at the j-th measurement point in the exposure region, that is, the position Zjk (k=1 to p) of the wafer surface in the optical axis AX direction. Here, since during an actual exposure process it is measured in the vicinity of the image plane of the projection lens, it is necessary that in the offset measurement the position is measured in the vicinity of the image plane. If the wafer surface shape is not deformed, in order to detect the surface shape of the whole wafer surface, the level of the wafer may be held fixed (by holding the height of the leveling state fixed) and surface measurement may be repeated while moving the wafer stage stepwise in the X and Y directions. However, with a repetition of wafer treatments, the shape of the whole wafer surface will be deformed into a concaved shape or a convexed shape such as illustrated in FIGS. 8A and 8B. If an oblique light projection type detection optical system is used for such a generally deformed wafer, executing the focus measurement while holding the wafer level fixed as shown in FIG. 8A will cause a lateral shift of the incidence position of the detection light beam with a change in the shape of the wafer or a change in the surface level of the wafer. This results in a misreading of the position, different from the pattern, which is inherently to be observed in the vicinity of the exposure image plane. In consideration of this, as shown in FIG. 8B, at respective measurement positions, the position of the Z stage is corrected and shifted toward the image plane. Referring back to FIG. 7, this operation will be explained.

First, at step 5, a leveling stage position detecting system (not shown) is used to detect the position of the leveling stage as the same is held at the same position as the exposure position within the X-Y plane. The position (Z0, α0, β0) of the leveling stage of the wafer stage 5 is memorized (measurement is done only with respect to the first point of a first sample shot, and the resultant data is used in a correction calculation for the remaining points). Thereafter, surface position measured data at the wafer surface is detected. By using that value, the wafer surface is moved to the image plane position, and Z correction drive is performed. By executing a Z correction drive of the wafer surface to the image plane position, the problem of a lateral shift of the detection light beam is solved (FIG. 8B). From the corrected position of the leveling stage (Zj, α0, β0) and the surface position measured data at that position, namely, from the data of the position Z0jk (k=1 to p) of the wafer surface in the optical axis AX direction, $$Zjk(k=1 \text{ to } p)=Z0jk+Zj-Z0$$

is calculated. The situation described above is an example wherein the correction amount (Zj−Z0) is based on the result of a detection of the position of the leveling stage in the Z direction. Since, however, the correction drive of the leveling stage is based on the magnitude of the measured value Z0jk, if the driving error of the leveling stage is negligible, a measured value Z0jk before correction drive and a value Z0jk after correction drive may be added. A signal corresponding to the position Z0jk (k=1 to p) is applied from the detecting means 19, comprising CCD linear sensors of a number "p" to a focus signal processing device 26. After correction calculation as described, it is memorized as a measured value at the j-th measurement point. Also, at step 6, the position (X,Y) of the wafer stage at that position is memorized.

At step 7, a discrimination is made as to whether a similar measurement has been done to all the measurement points (j=1 to n), and, if not, the wafer is moved to the subsequent measurement point (step 4) and a similar measurement is repeated. If all the measurement points are completed, then at step 8 a discrimination is made as to whether a measurement to all the sample shots (i=1 to m) is completed or not. If not, the sequence goes back to step 3.

If at step 8 completion of the measurement to all the sample shots is confirmed, then at step 9 an offset correction amount Cjk at every sensor position and every measurement point, at the measurement position in the exposure region, is calculated. In relation to this calculation, Japanese Patent Publication, Publication No. 52707/1990 discloses a surface position detecting method for a stepper, wherein a measurement is made to a single point in an exposure region. In the present invention, taking into account the applicability to a scanning exposure apparatus, the following modification is made so that it can be used for measurement offset correction at plural points in an exposure region. That is, on the basis of measured value Zjk of measurement sensors k at measurement points j within the exposure position as obtainable with the present offset measurement sequence, surface shape functions Fnp(x,y) (the number of data points of each surface shape function corresponds to m points of sample shot Si (i=1 to m)) that represents the wafer surface shapes of a number "nxp", are determined. The order of a curved surface or an expansion equation of these surface shape functions Fnp(x,y) are determined beforehand in terms of a predetermined polynomial. For determining offset amounts of respective surfaces, the measured value Zjk is used as surface position data and, by using a least square method, the coefficient of Fnp, that is, the offset correction amount, is determined.

More specifically, a constant term Cjk that satisfies the following relation is determined:

$$\int\int(Fjk(x,y)-Zjk(x,y))2dxdy=0 \ (j=1 \text{ to } n, k=1 \text{ to } p).$$

The sequence of the correction value calculation will be explained with reference to FIG. 9A and in connection with an example wherein the number m of sample shots is m=3, the number j of measurement points is j=3 and the number k of measurement sensors is k=3. For convenience in explanation, it is assumed that the flatness of the wafer is one dimensional and, in terms of an equation of a plane aX+bY+cZ=d, it is assumed that b=c=0.

Figure 9A:
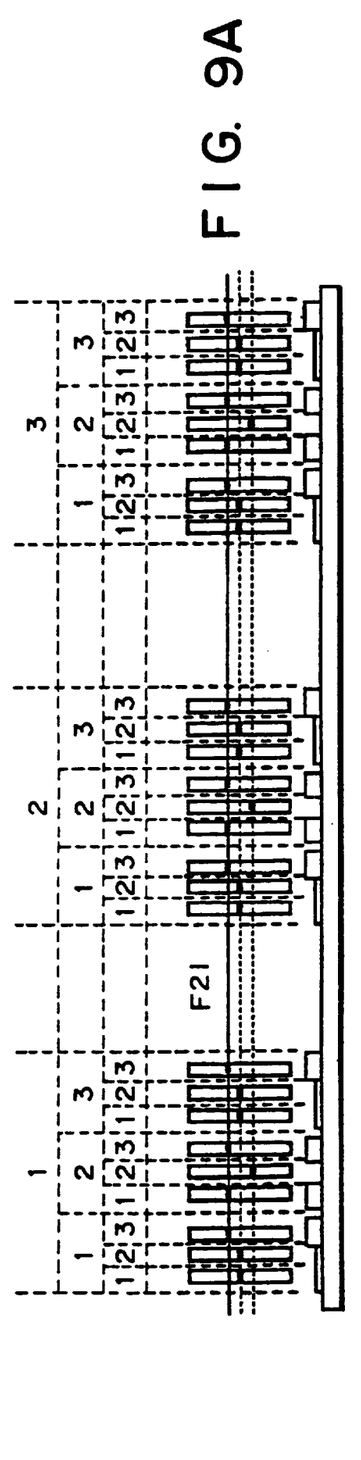
FIGS. 9A through 9C are schematic views for explaining details of offset calculation.

The sectional structure of the wafer is such as shown in FIG. 9A wherein, at a measurement point j=1, measuring sensors k=1, 2 measure the same level and only a sensor k=3 measures a surface step (for example, at portions k=1, 2 of a memory cell region where underlying materials are different, due to the effect of interference, the measured value shifts to the substrate side), and this structure is repeated at j=3. At the measurement point j=2, only by k=2, a large measurement value is produced (for example, a peripheral circuit region as compared with a memory cell). Since the pattern in this exposure region is consistent within the range of alignment precision, when the sample shots of m=1 to 3 are measured, the surface position measured value Zjk is reproduced.

Figure 9B:
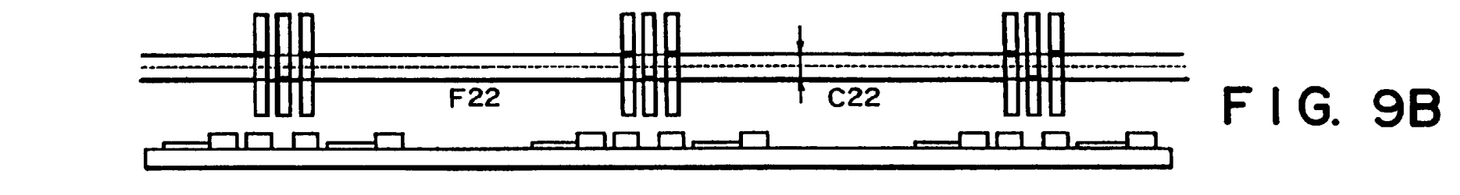
Figure 9C:
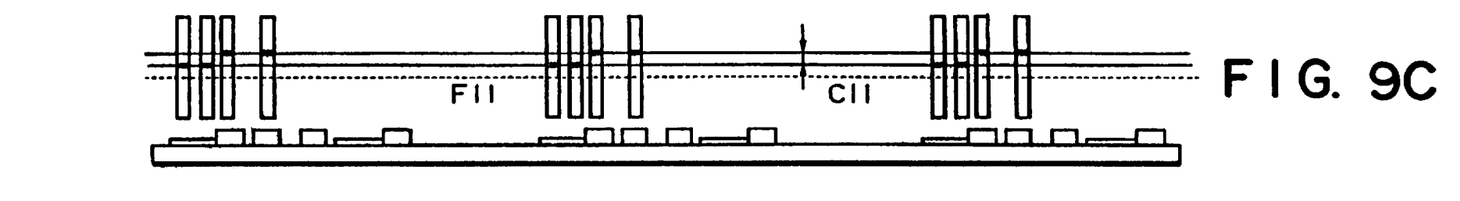

From measured values Zjk of a number twenty-seven produced in this manner, an offset Cjk is determined by the following calculation. That is, by using data Z21 in FIG. 9A as a reference (offset C21 at this position with respect to the image plane of the projection lens can be determined by actual exposure using a preceding wafer, for example), another offset Cjk is detected. Now, the surface F21 as formed by measured data Z21 of m=1 to 3 is taken as a reference, that is, a constant term 0. In order to determine an offset C22 of Z22 corresponding to a peripheral circuit region, as shown in FIG. 9B, a difference related to the shape of the wafer between the surface shape functions F22 and F21 as determined by the measured values at Z22 of m=1 to 3, may be detected.

Here, the difference corresponds to a difference of d (segment) called in an equation of a plane, and its value can be calculated as C22 in the drawing. Similarly, with regard to C11 of Z11 being shifted due to the effect of interference, it may be detected as a difference of a segment between F21 and F11. A similar calculation is made for a detection of another offset Cjk, and the results are stored into a memory.

Referring to FIGS. 7 and 10A through 10D, the procedure of focus position measurement at each exposure position, the measured value correction based on Djk, and the correction of the leveling stage position, will be explained.

Figure 10A:
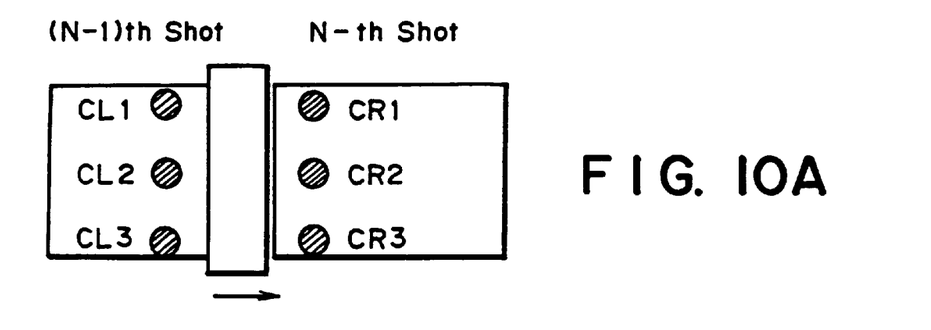
FIGS. 10A through 10D are schematic views for explaining a positional relationship between the slit and the surface position sensor means during a slit-scan exposure.

At steps 11 and 12, the wafer stage 5 is moved to the position where the first measurement point of the N-th shot (N=1 to w) is reached, that is, the position where during the exposure the focus measuring beam comes to the first measurement point of the N-th shot is reached. This will be explained in detail. At step 12, a Zjk measured value at the first measurement point of the N-th shot, more specifically, detection signals from three CCD linear sensors of the photoelectrically converting means unit 19 responsive to measurement beams to CR1, CR2 and CR3 in FIG. 10A, are processed by the focus signal processing device 26, and height data Z11, Z12 and Z13 are produced. These height data involve offset errors due to a surface step or a measurement error due to interference. In consideration thereof, correction data of Cjk obtained at step 9 is used to detect a difference in the following manner to determine correct surface position measured data ZTjk of the wafer.

$$ZTjk=Zjk-Cjk.$$

The value Cjk calculated here involves only a component of wafer deformation within an exposure area where a measurement offset attributable to the resist surface is corrected. Thus, on the basis of this surface position data, a least square plane is calculated (step 14).

Subsequently, at step 15, the wafer stage 5 is moved in the optical axis direction and in the tilt direction so as to correct the difference between the position of the leveling stage at the time of Zjk measurement and the current position thereof and to correct the difference between the exposure image plane of the projection lens 1 and the least square plane. By this, the exposure area of the wafer is brought into coincidence with the image plane of the projection lens. When correction drive for the j-th measurement points is completed, at step 16, a discrimination is made as to whether all the measurement points are completed. Measurement and correction drive are repeated until j=n is satisfied.

Figure 10B:
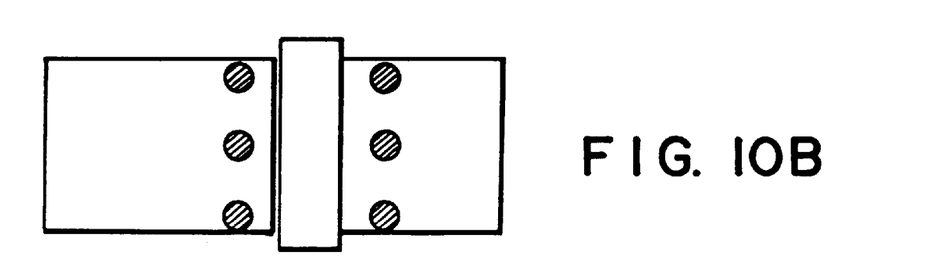
Figure 10C:
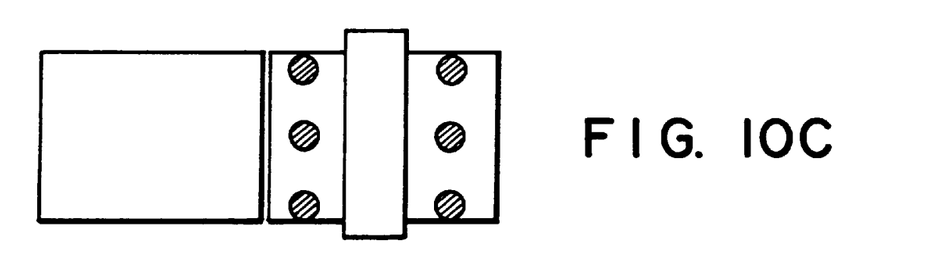
Figure 10D:
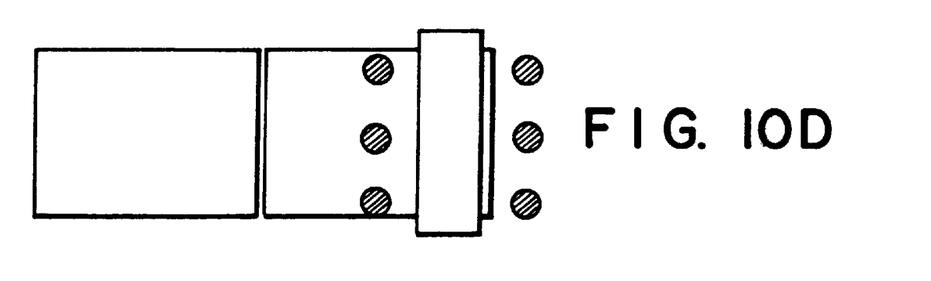

More specifically, in the state of FIG. 10B, a correction is made using data j=1 and, simultaneously, focus measurement and offset correction are performed at the point j=2. By using this correction data, at the stage where the position of FIG. 10C is going to be scanned, correction is made using data j=2 and, simultaneously, focus measurement and offset correction are performed at the point j=3. By using this correction data, at the stage where the position of FIG. 10D is going to be scanned, correction is made using data j=3. When measurement and correction are completed up to point j=n, at step 17, a discrimination is made as to whether all the shots of the wafer are completed or not. Scan exposure of the shots is repeated until N=w is satisfied.

The procedure of determining an offset value, as a correction amount and from the measured data, for a measurement error or a surface step, which raises a problem in the detection of surface position or tilt of the wafer, that is, the procedure of calibration for sensors of a multiple point focus detecting mechanism, should be done with respect to each of different processes wherein different patterns are formed. However, it is sufficient to perform the measurement only to one wafer in one lot. For the remaining wafers in the same lot, an offset Cij obtained with reference to the first wafer and stored in a memory may be used in the focus measurement and correction. This enables high precision leveling correction and exposure without decreasing the throughput.

In the embodiment described above, an example has been explained wherein an offset depending on the pattern of the wafer is corrected. However, the invention is not limited to this. For example, conventionally, for calibration of an origin in multiple point focusing, a high precision flat surface is prepared or, alternatively, an actual exposure is executed. In contrast, by performing the above-described procedure to a wafer having no pattern formed, offset for focus sensor mounting positions can be determined easily. Also, the invention is not limited to a "surface". When a detection sensor for detecting a level of a single point is used to perform scan focusing, a similar offset correction procedure may be carried out to hold the surface of a memory cell at the image plane position, for example.

In the embodiment described above, one point in an exposure region such as a point in a memory cell, where focus depth is most strict, is selected and exposed beforehand to thereby determine the best focus. However, the invention is not limited to a "single point". Further, in a case wherein it is desired to perform a measurement at one point to detect a change in the environment of a lens, for example, to change the focus correction position separately within the exposure region, that is, in a case of a logic device, for example, whose surface height changes with location, the data Cij of the surface position data offset may be corrected on the basis of a design value. More particularly, while taking into account the width of an illumination region slit and from a two-dimensional map as defined by Cij, if the region with respect to which the offset should be changed is wider, Cij may be corrected by a value corresponding to the surface step.

While the invention has been described with reference to the structures disclosed herein, it is not confined to the details set forth and this application is intended to cover such modifications or changes as may come within the purposes of the improvements or the scope of the following claims.

What is claimed is:

1. A surface position detecting method usable with an object having a region with a pattern structure, wherein the object is scanningly moved relative to a surface position detecting system and in a scan direction different from a surface position detecting direction of the surface position detecting system and, during the relative scan, the surface position detecting system detects, sequentially, a surface position at plural detection points within the region, placed along the scan direction, said method comprising the steps of:

measuring beforehand errors to be produced with respect to the detection points due to a difference in pattern structure among the detection points disposed along the scan direction; and correcting, by the surface position detecting system, when the surface position detection is sequentially performed by the surface position detecting system at the detection points along the scan direction while the object is scanned in the scan direction relative to the surface position detecting system, measurement error with respect to each detection point, on the basis of a measured error corresponding to that detection point, measured in said measuring step.

2. A method according to claim 1, wherein the object has a plurality of regions each having the same pattern structure as that of the first-mentioned region, and wherein said method further comprises correcting, as the object is relatively and scanningly moved relative to the surface position detecting system so that the surface positions at locations within the regions corresponding to the detection points are detected by the surface position detecting system, the result of the detection at each detection point, on the basis of an error corresponding to that detection point.

3. A method according to claim 2, further comprising an error detecting step, which comprises detecting a surface shape of the object on the basis of surface position data related to corresponding locations in the regions, and detecting the error on the basis of the surface shape.

4. A scanning projection exposure method usable with an object having a region with a pattern structure, wherein the object is scanningly moved relative to a surface position detecting system and in a scan direction different from a surface position detecting direction of the surface Position detecting system and, during the relative scan, the surface position detecting system detects, sequentially, a surface position at plural detection points within the region, placed along the scan direction, said method comprising the steps of:

measuring beforehand errors to be produced with respect to the detection points due to a difference in pattern structure among the detection points disposed along the scan direction; and correcting, by the surface position detecting system, when the reticle pattern is scanningly transferred to the exposure region of the wafer through the projection optical system while the surface position detection is sequentially performed at the detection points along the scan direction and the exposure region is placed in registration with the image plane of the projection optical system, measurement error with respect to at each detection point, on the basis of a measured error corresponding to that detection point, measured in said measuring step.

5. A method according to claim 4, wherein the wafer has a plurality of regions each having the same pattern structure as that of the first-mentioned region, and wherein said method further comprises correcting, as the surface positions at locations within the regions corresponding to the detection points are detected sequentially, the result of the detection at each detection point, on the basis of an error corresponding to that detection point.

6. A method according to claim 5, further comprising an error detecting step, which comprises detecting a surface shape of the wafer on the basis of surface position data related to corresponding locations in the regions, and detecting the error on the basis of the surface shape.

7. A method of detecting a surface shape of an object having regions with the same pattern structure, wherein surface positions at corresponding locations in the regions of the object are detected by using a surface position detecting system arranged to detect a surface position with light projected obliquely to the object, said method comprising:

a first detecting step for detecting surface positions at corresponding locations within the regions by using the surface position detecting system;

a driving step for moving the object to a predetermined position on the basis of the detection in said first detecting step;

a second detecting step for detecting again, after said driving step, the surface positions at the corresponding locations in the regions by using the surface position detecting system; and a calculating step for calculating the surface shape of the object on the basis of (i) a driving amount in said driving step and (ii) the detection in said second detecting step.

* * * * *